US006019188A

United States Patent [19]

Nevill

[11] Patent Number: 6,019,188

[45] Date of Patent: Feb. 1, 2000

[54] ENCLOSURES FOR LOUDSPEAKER DRIVE UNITS

[75] Inventor: Stuart Michael Nevill, Kent, United Kingdom

[73] Assignee: B & W Loudspeakers Limited, Worthing, United Kingdom

[21] Appl. No.: 08/951,656

[22] Filed: Oct. 16, 1997

[30] Foreign Application Priority Data

Oct. 21, 1996 [GB] United Kingdom .................. 9621898

[51] Int. Cl.[7] ....................................... H05K 5/00

[52] U.S. Cl. ....................................... 181/156; 181/199

[58] Field of Search .............................. 181/156, 151, 181/199, 160; 381/154, 159

[56] References Cited

U.S. PATENT DOCUMENTS

| | | | |
|---|---|---|---|
| 4,126,204 | 11/1978 | Ogi et al. | 181/156 |
| 4,231,445 | 11/1980 | Johnson . | |
| 5,012,890 | 5/1991 | Nagi et al. | 181/160 |
| 5,025,885 | 6/1991 | Froeschle | 181/156 |
| 5,150,417 | 9/1992 | Stahl | 181/156 |
| 5,714,721 | 2/1998 | Gawronski et al. | 181/156 |

FOREIGN PATENT DOCUMENTS 2 045 578 10/1980 United Kingdom .

OTHER PUBLICATIONS

M Colloms, "High Performance Loudspeakers", 4th edition, published 1991, Pentach Press, pp. 122–123.

*Primary Examiner*—Khanh Dang

*Attorney, Agent, or Firm*—Burns, Doane, Swecker & Mathis, L.L.P.

[57] ABSTRACT

An enclosure (1) for a loudspeaker drive unit (5) comprises a chamber (2) defined by one or more walls (3), in which a loudspeaker drive unit (5) is to be mounted. A port member (4) defines a passageway providing fluid communication between the interior and the exterior of the chamber (2). The internal surface (9) of the port member (4) is, at least in part, of a coarse texture. A multiplicity of indentations (11) and/or peaks may provide the coarse texture. This reduces so-called "chuffing" noises caused by air movement through the port member.

17 Claims, 6 Drawing Sheets

ENCLOSURES FOR LOUDSPEAKER DRIVE UNITS

This invention relates to enclosures for loudspeaker drive units.

Known enclosures include port members, generally in the form of circular cylindrical tubes, to improve the acoustic properties of the enclosure, especially when the effective internal volume is small. Such port members have a characteristic resonant frequency of their own and enable the overall frequency response of the enclosure to be modified to achieve a more satisfactory overall result.

It is an object of the present invention to provide an improved enclosure for loudspeaker drive unit.

According to the invention there is provided an enclosure for a loudspeaker drive unit, the enclosure comprising:

- a chamber defined by one or more walls, in which a loudspeaker drive unit is to be mounted, and
- a port member defining a passageway providing fluid communication between the interior and the exterior of the chamber, characterized in that:
  - the internal surface of the port member is, at least in part, of a coarse texture.

The invention is based on the realization that the port members used in the prior art introduced undesirable sounds owing to the interaction of the moving air with the port member. It has been discovered that turbulence effects arose and affected the quality of sound detrimentally, especially when the movement of air in the port was relatively large. In such circumstances, sounds, which may be termed "chuffing" noises, arise.

Drive units in enclosures of the prior art, naturally caused movement of air in and around the port member. The movement of air beyond the port member tended to be in a notional cylinder corresponding to an imaginary extension of the port member. In an enclosure according to the invention, however, the pattern of movement of air beyond the port member is more diffuse, owing to the coarse texture of the internal surface of the port member.

Instead of the air movements tending to be within a notional cylinder, they tend rather to be within a conical or hyperboloid shape. That has the effect of reducing the undesirable "chuffing" noises.

Advantageously, a multiplicity of indentations in the surface of the port member provides the coarse texture. That provides a simple way of obtaining the coarse texture.

Alternatively, a multiplicity of peaks on the surface of the port member may provide the coarse texture.

If desired, a multiplicity of indentations in the surface of the port member and a multiplicity of peaks on the surface of the port member may provide the coarse texture.

The shape and size of the indentations and/or peaks are chosen to create the desired coarseness of texture. The indentations and/or peaks do not, of course, all need to be of the same shape and size.

If desired, the dimensions of the indentations and/or peaks could be made a function of their position within the port member. For example, the indentations and/or peaks can be so configured that the sizes of the respective indentations and/or peaks decrease with their distance along the port member from its end remote from the loudspeaker drive unit.

Advantageously, the indentations and/or peaks are generally misaligned with one another. The presence of misalignment or disorder will tend to avoid the creation of unwanted resonances caused by a regular pattern of indentations and/or peaks.

Alternatively, the indentations and/or peaks may be generally aligned with one another. For example, the indentations and/or peaks may be arranged in rows and columns. The indentations and/or peaks may be arranged in a single array of rows and columns.

Instead, the indentations and/or peaks may be arranged in two interleaved arrays of rows and columns with alternate lines of indentations and/or peaks in alignment with each other.

Preferably, each indentation and/or peak has a depth/height less then its diameter. The depth/height of such indentations/peaks is particularly suited to producing the desired coarse texture without being so deep as to introduce any unwanted acoustic characteristics. Such relatively shallow indentations/peaks are also easier to manufacture, especially if the port member is produced by moulding.

Each indentation and/or peak may be round in cross-section. A round shape for the indentations and/or peaks can assist in reducing turbulent flow and/or resonances.

Each indentation and/or peak may be polygonal in cross-section. The packing density of the indentations and/or peaks can be increased by use of a polygonal cross-sectional shape.

Preferably, the diameter of each indentation and/or peak is between 1 and 10 millimeters, more preferably, between 2 and 6 millimeters, and yet more preferably, between 2 and 4 millimeters.

Preferably, there are between 1 and 25 indentations and/or peaks per square centimeter, more preferably, between 5 and 15 indentations and/or peaks per square centimeter (where, for example, 10 "indentations and peaks" per square centimeter could be made up of 5 indentations and 5 peaks per square centimeter).

It is particularly preferred that the size and arrangement of the indentations correspond generally to those found on the exterior surface of a golf ball.

If desired, only a part of the interior surface may have a coarse texture. By that means manufacture can be simplified and no greater area of coarse texture provided than is desired.

Preferably, the said part is adjacent to the end of the port member remote from the location for the loudspeaker drive unit. If only a part of the interior surface is of a coarse texture, the reduction of "chuffing" noises is more effective when the part is so located.

Alternatively, substantially all of the interior surface may have a coarse texture.

The enclosure may define a single chamber.

Alternatively, the enclosure may have an internal wall dividing the enclosure into two chambers and the port member pass through the internal wall.

The coarse texture may be provided by a layer of material on the internal surface of the port member.

The layer of material may be a layer of moulded plastics material.

Preferably, the port member may have an internal volume between 200 and 800 cubic centimeters.

The overall volume of the enclosure may be between 1000 and 20,000 cubic centimeters.

At least one end of the port member may be flared. The provision of one or more flared ends assists in making the air movement pattern more diffuse at the end(s). Preferably both ends are flared.

Enclosures for loudspeaker drive units in accordance with the invention will now be described, by way of example, with reference to the accompanying drawings, in which FIG. 1*a* is a schematic bottom view of an enclosure according to the invention provided with a drive unit;

FIG. 1*b* is a schematic sectional side view taken along the line A—A of the enclosure shown in FIG. 1*a;*

Figure 3:
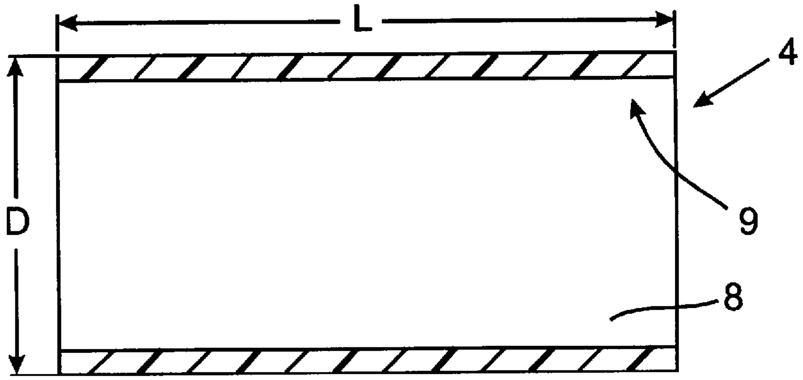
FIG. 3 is a sectional view of the tuning port of FIGS. 1*a* and 1*b;*
Figure 4A:
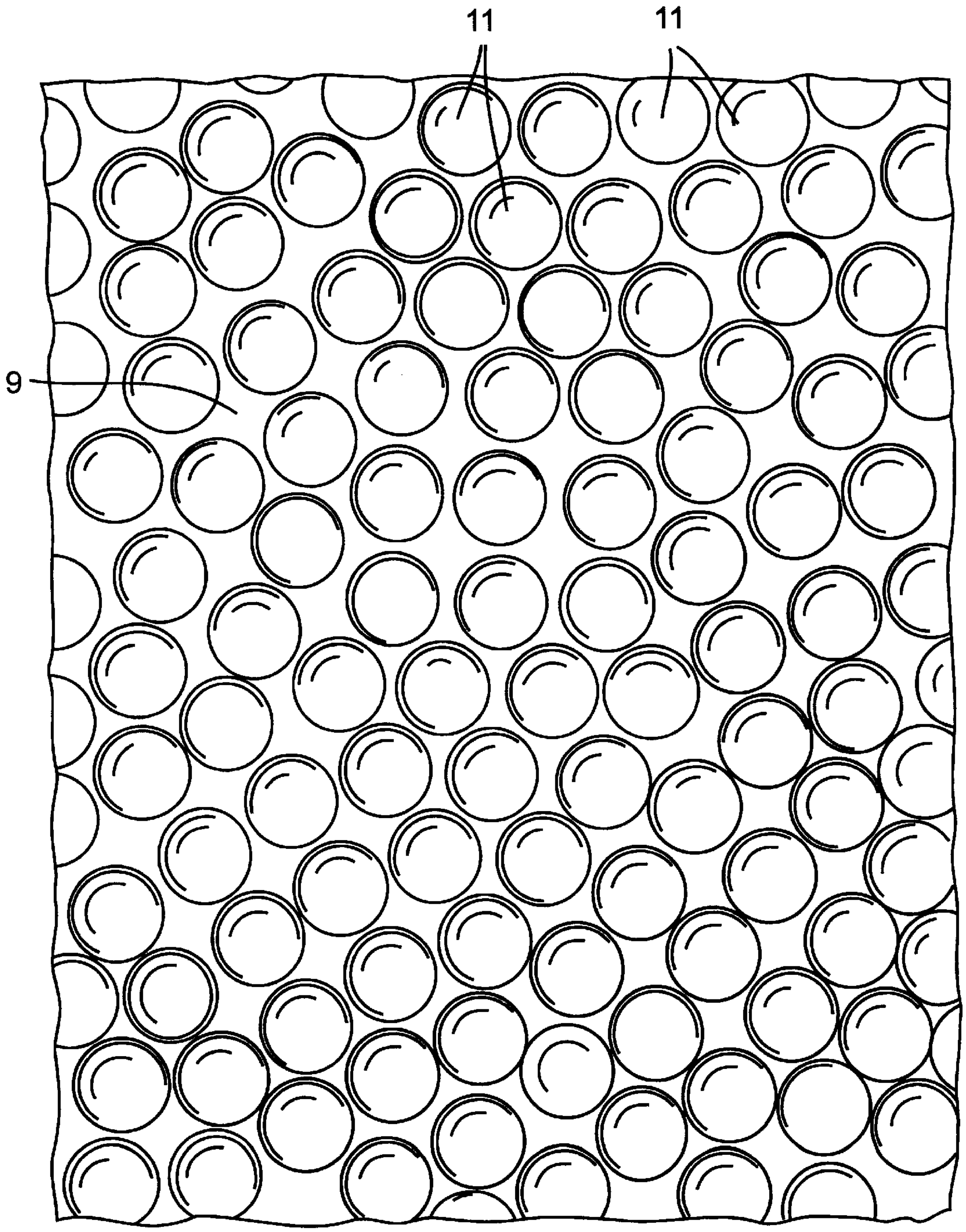
Figure 4B:
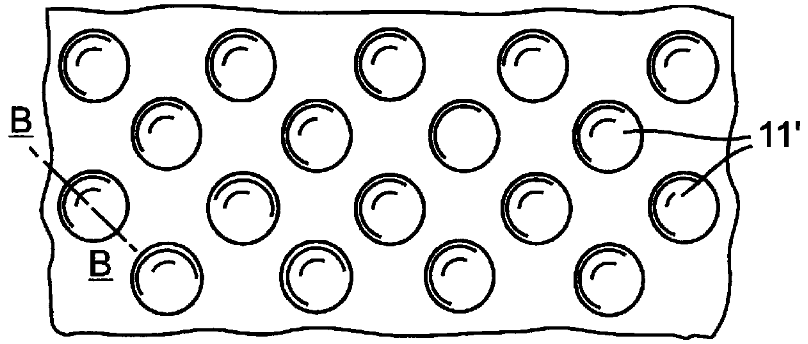
Figure 4C:
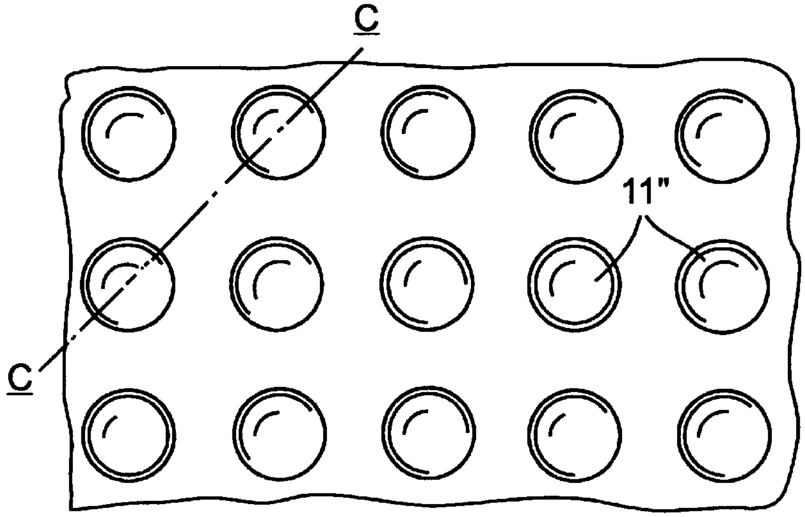
Figure 4D:
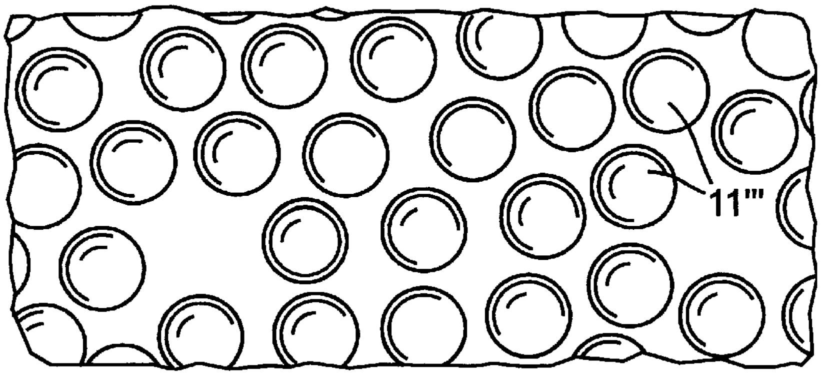
Figure 5A:
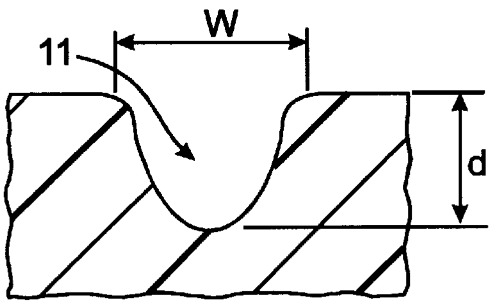
Figure 5B:
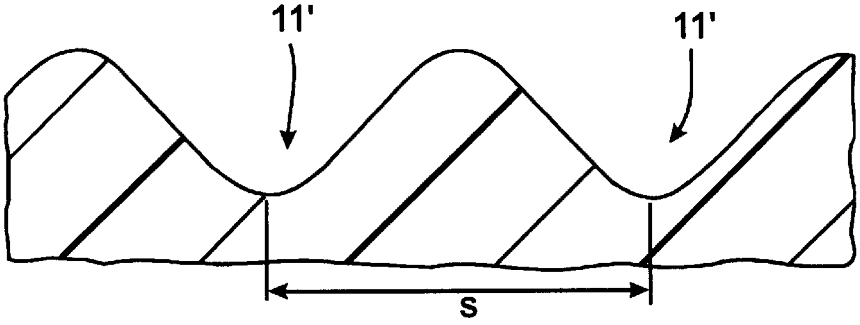
Figure 5C:
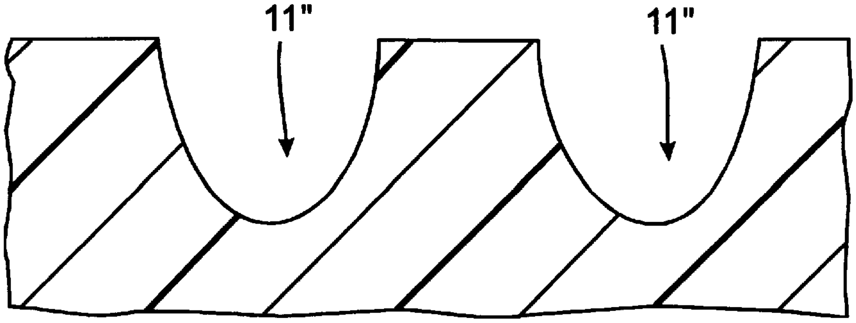

FIG. 4*a* is a developed view of a portion of the interior surface of the tuning port shown in FIG. 3;

FIGS. 4*b* to 4*d* are developed views of portions of the interior surfaces of further tuning ports for use in the invention;

FIG. 5*a* is a partial vertical cross-section of the tuning port of FIG. 4*a* showing a single indentation in cross-section;

FIG. 5*b* is a partial vertical cross-section of the tuning port of FIG. 4*b* taken along the line B—B showing the surface of that tuning port; and FIG. 5*c* is a partial vertical cross-section of the tuning port of FIG. 4*c* taken along the line C—C showing the surface of that tuning port.

Figure 6:
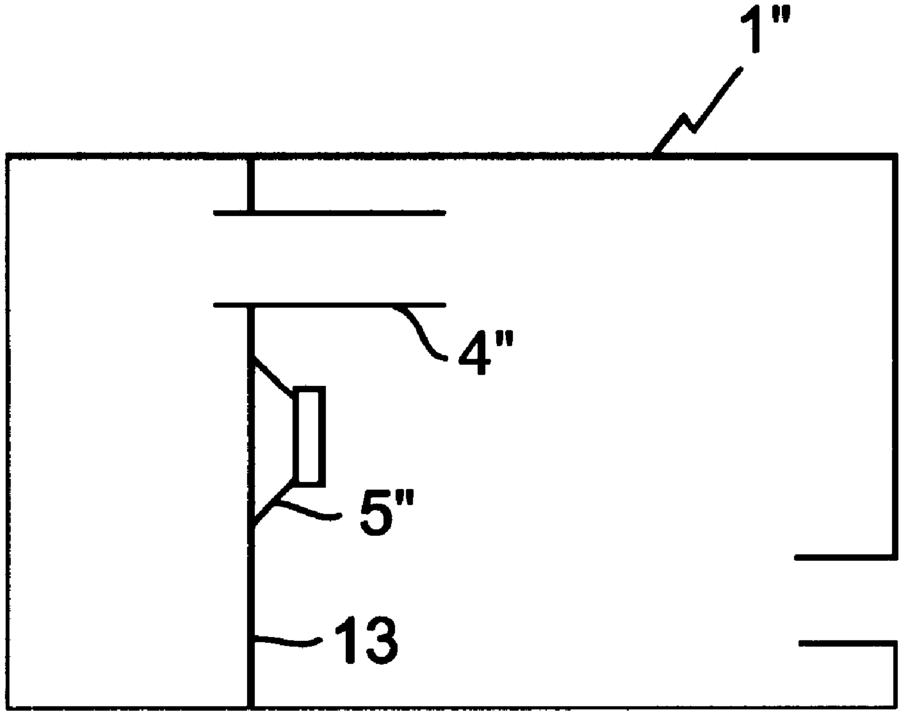

FIG. 6 is a diagramatic representation of an alternative embodiment of the present invention.

Figure 1A:
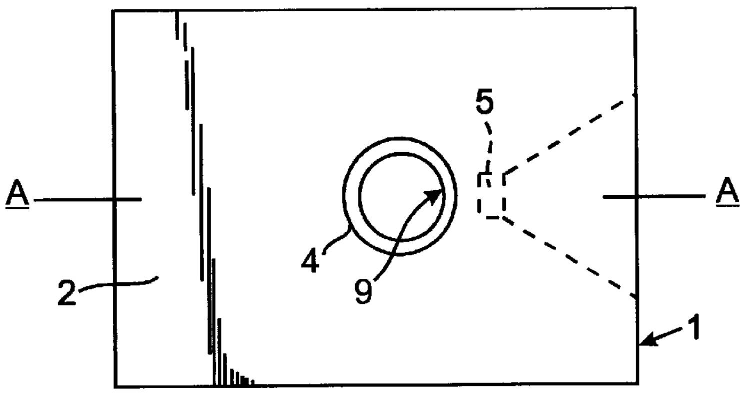
Figure 1B:
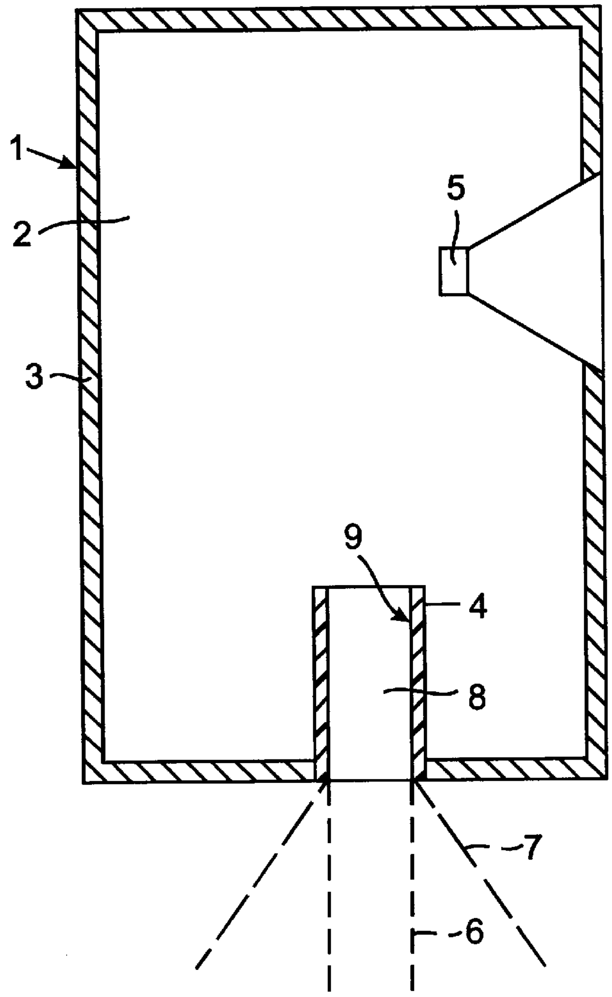

Referring to the accompanying drawings, FIG. 1*a* shows the underside of a loudspeaker enclosure 1, a cross-section of which (along the line A—A) is shown schematically in FIG. 1*b*. The enclosure 1 is of rectangular box-like shape. A chamber 2 is defined by the six walls 3 of the enclosure 1. A port member 4 of circular cylindrical form is mounted in the enclosure 1 by means of one end inserted into an aperture in the bottom wall of the enclosure 1. A loudspeaker drive unit is mounted in an aperture in one of the side walls. The volume of the enclosure 1 is approximately 10 liters.

The interior surface 9 of the port member has a coarse texture.

FIG. 3 shows a simplified view of a section of the tuning port member 4 of FIG. 1*a* taken along the section line A—A. Indentations 11 (not shown in FIG. 3) on the interior surface 9 of the tuning port member 4 are provided on the internal surface of the exterior end 8 of the port to create the coarse texture.

The diameter D of the port is 5 cm and the length L of the port is 10 cm. The cross-sectional area of the port is thus about 0.002 $m^2$.

The tuning port can be constructed in two halves by moulding plastics material, the two halves then being fixed together by adhesive, for example. The half-tubes can be produced in a mould having projections to form the indentations on what is to be the inner surface of the port member.

FIG. 4*a* shows a developed view of a portion of the interior surface 9 at the exterior end 8 or the tuning port member. The circular indentations 11 are like the dimples on a golf ball. The pattern of indentations is such that, overall, the indentations are misaligned or exhibit disorder, notwithstanding that there are regions which have local symmetry. For example, there are several triangular blocks of six indentations and at least three square blocks of three by three indentations shown in FIG. 4*a*.

FIG. 5*a* shows an indentation 11 in cross-section. Its depth d is about 0.5 mm and its diameter is about 3 mm. The average density of the indentations on the interior surface 9 at the exterior end 8 of the tuning port member is about six per square centimeter.

The coarse texture on the interior surface of the tuning port causes the pattern of movement of air outside the enclosure in the region of the tuning port caused by the drive unit 5 to be diffuse, as if the air flowing out of the port were bent or refracted at the exterior end 8 of the port.

When the tuning port member has a smooth interior surface as in the prior art, the greatest air movements of air are mostly within a notional cylinder 6, (see FIG. 1*b*), which is roughly an imaginary extension of the interior surface 9 of the tuning port member 4.

It has been recognized that undesirable "chuffing" noises to be heard from enclosures of the prior art can, at least partly, be attributed to such high concentrations of air movement. If, in particular, the concentrated movements of air interact with the local surroundings, such as the walls and floor of the room in which the speaker is located, to cause turbulence, such turbulence contributes to the observed "chuffing" noises.

When, however, the interior surface 9 has the coarse texture described, the air flows out in a shape that flares outwardly, the air flowing in a shape rather like a truncated cone 7. Compared with a conventional port member, the air movements are spread over a greater area and the intensity of air movement is less. Thus, turbulence tends to be reduced and "chuffing" noises likewise tend to be reduced.

The invention is particularly valuable when the port member is mounted so as to face downwards out of the enclosure.

The air flowing out of a similarly-located conventional port tends to strike the ground in a direction normal to the ground, creating turbulence and "chuffing" noises, whereas when a port member having the described coarse texture is used, the air flows in a variety of different directions which allows the air to flow more smoothly along the floor thereby reducing turbulence and "chuffing" noises.

Figure 2:
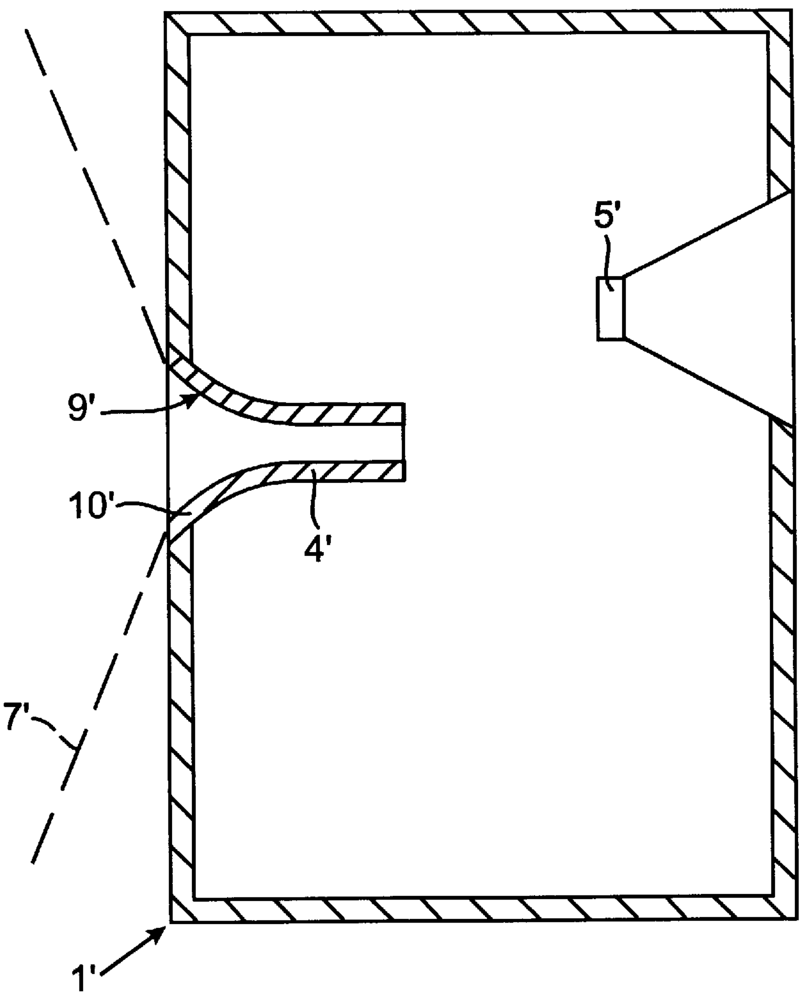
FIG. 2 is a schematic sectional side view of a further enclosure according to the present invention.

According to a second embodiment of the invention, FIG. 2 shows a enclosure 1' in cross-section. The enclosure has a tuning port member 4' mounted in an aperture in a side wall of the enclosure and a loudspeaker drive unit 5' mounted in an aperture in the opposite side wall. The interior surface 9 of the port 4' has a multiplicity of indentations.

The tuning port member 4' has a flared outer end 10' so that the pattern of air movements exterior to the enclosure caused by the drive unit 5' is even more diffuse than that that provided by the tuning port 5 of FIGS. 1*a* and 1*b*.

The notional truncated cone 7', within which most of the air movements caused by the drive unit 5' are contained, has a greater degree of flare than that of the notional truncated cone 7 of the embodiment shown in FIGS. 1*a* and *b*.

The flared outer end 10' in combination with the coarse textured interior surface 9 reduces directivity at low frequencies so that bass sounds are transmitted over a wide range of angles. "Chuffing" noises are reduced.

The flared end 10' of the port member can be an exponential or other curved flare, or a straight flare.

FIGS. 4*b*, 4*c* and 4*d* show examples of other shapes and configurations of indentations illustrated in developed view. The indentations may cover the whole of the interior surface of the port or simply a part thereof.

FIG. 4*b* shows indentations that are less densely packed than those in FIG. 4*a* and are arranged in a different configuration. The indentations are arranged in rows, the indentations in each row being adjacent to the midpoint between indentations in the next row, so that every other row is in alignment. The configuration of FIG. 4*b* can be described as a notional square grid having indentations at the respective corners and centres of the squares of the grid.

FIG. 4*c* shows indentations arranged in rows and columns. Other configurations of indentations are suitable. For example, the configuration may be such that the indentations are located at the vertices of a multiplicity of tessellating notional regular hexagons. Other notional grids can form the basis for a suitable configuration, such as a grid of tessellating mixed shapes.

Of course the indentations do not have to be circular in cross-section, or even be the same shape and size as each other, nor do they necessarily have to be arranged with repeat patterns. For example, a substantially random arrangement can be seen in FIG. 4*d*.

FIG. 5*b* shows the indentations 11 of FIG. 4*b* in vertical cross-section along the line B—B and shows that the indentations form a smoothly undulating surface.

FIG. 5*c* shows the indentations 11 of FIG. 4*c* in vertical cross-section along the line C—C. The separation s of the indentations is about 4 mm and the diameter w of each indentation is about 3 mm. The density of the indentations is thus about six per square centimeter (sixty thousand per square meter).

Although, the use of indentations has been described and illustrated, peaks of corresponding size and packing density could be used instead.

A port member 4" with a coarse interior texture can be used in an enclosure 1" which is divided into two internal chambers by an internal wall 13 with the port member passing through the internal wall 13. A loud speaker drive unit 5" is also mounted in the internal wall 13. See FIG. 6.

The coarse texture can, if desired, be produced by adhesively securing a layer of textured material (such as that forming the outer skin of a golf ball) on the interior of a smooth-walled tube. A moulded plastics material is suitable for the purpose.

The port member can be located on any surface of the enclosure.

I claim:

1. An enclosure for a loudspeaker drive unit, the enclosure comprising:

a chamber defined by one or more walls enclosing an internal volume, said one or more walls including an aperture at which a loudspeaker drive unit is to be mounted, and a port member mounted in said chamber and having an internal surface defining a passageway having a first end opening into said internal volume and a second end opening outside said chamber, said port member providing fluid communication between said internal volume and an exterior of the chamber, the internal surface of said port member being, at least in part, provided with a multiplicity of indentations, wherein the diameter of each indentation is between 2 and 4 millimeters.

2. An enclosure for a loudspeaker drive unit, the enclosure comprising:

a chamber defined by one or more walls enclosing an internal volume, said one or more walls including an aperture at which a loudspeaker drive unit is to be mounted, and a port member mounted in said chamber and having an internal surface defining a passageway having a first end opening into said internal volume and a second end opening outside said chamber, said port member providing fluid communication between said internal volume and an exterior of the chamber, the internal surface of said port member being, at least in part, provided with a multiplicity of indentations, wherein there are between 5 and 15 indentations per square centimeter.

3. An enclosure for a loudspeaker drive unit, the enclosure comprising:

a chamber defined by one or more walls enclosing an internal volume, said one or more walls including an aperture at which a loudspeaker drive unit is to be mounted, and a port member mounted in said chamber and having an internal surface defining a passageway having a first end opening into said internal volume and a second end opening outside said chamber, said port member providing fluid communication between said internal volume and an exterior of the chamber, the internal surface of said port member being, at least in part, provided with a multiplicity of indentations, wherein each indentation has a depth less than its diameter.

4. An enclosure for a loudspeaker drive unit, the enclosure comprising:

a chamber defined by one or more walls enclosing an internal volume, said one or more walls including an aperture at which a loudspeaker drive unit is to be mounted, and a port member mounted in said chamber and having an internal surface defining a passageway having a first end opening into said internal volume and a second end opening outside said chamber, said port member providing fluid communication between said internal volume and an exterior of the chamber, the internal surface of said port member being, at least in part, provided with a multiplicity of indentations, wherein each indentation is round in cross-section.

5. An enclosure for a loudspeaker drive unit, the enclosure comprising:

a chamber defined by one or more walls enclosing an internal volume, said one or more walls including an aperture at which a loudspeaker drive unit is to be mounted, a port member mounted in said chamber and having an internal surface defining a passageway having a first end opening into said internal volume and a second end opening into said chamber, said port member providing fluid communication between the internal volume and an exterior of the chamber, and moulded plastic material defining, on at least a part of the internal surface of said port member, a multiplicity of indentations located in said internal surface, said indentations being generally misaligned with one another, and wherein each indentation is round in cross-section.

6. An enclosure for a loudspeaker drive unit, the enclosure comprising:

a chamber defined by one or more walls enclosing an internal volume, said one or more walls including an aperture at which a loudspeaker drive unit is to be mounted, a port member mounted in said chamber and having an internal surface defining a passageway having a first end opening into said internal volume and a second end opening into said chamber, said port member providing fluid communication between the said internal volume and an exterior of the chamber, and moulded plastic material defining, on at least a part of the internal surface of said port member, a multiplicity of indentations located in said internal surface, said indentations being generally misaligned with one another, and wherein each indentation has a depth less than its diameter.

7. An enclosure for a loudspeaker drive unit, the enclosure comprising:

a chamber defined by one or more walls enclosing an internal volume, said one or more walls including an aperture at which a loudspeaker drive unit is to be mounted, and a port member mounted in said chamber and having an internal surface defining a passageway having a first end opening into said internal volume and a second end opening outside said chamber, said port member providing fluid communication between said internal volume and an exterior of the chamber, the internal surface of said port member being, at least in part, provided with a multiplicity of surface features selected from the group consisting of a multiplicity of indentations, a multiplicity of peaks, and a multiplicity of peaks and indentations, said surface features being provided in said internal surface of said port member and the diameter of each of said surface features being between 1 and 10 millimeters.

8. An enclosure as set forth in claim 7, wherein the diameter of each of said surface features is between 2 and 6 millimeters.

9. An enclosure as set forth in claim 7, wherein said surface features are generally misaligned with one another.

10. An enclosure as claimed in claim 7, wherein said surface features are provided in a flared end portion of said port member, said flared end portion being located at the exterior of said chamber.

11. An enclosure for a loudspeaker drive unit, the enclosure comprising:

a chamber defined by one or more walls enclosing an internal volume, said one or more walls including an aperture at which a loudspeaker drive unit is to be mounted, and a port member mounted in said chamber and having an internal surface defining a passageway having a first end opening into said internal volume and a second end opening outside said chamber, said port member providing fluid communication between said internal volume and an exterior of the chamber, the internal surface of said port member being, at least in part, provided with a multiplicity of surface features selected from the group consisting of a multiplicity of indentations, a multiplicity of peaks, and a multiplicity of peaks and indentations, said surface features being provided in said internal surface of said port member, there being between 1 and 25 of said surface features per square centimeter.

12. An enclosure as set forth in claim 11, wherein there are between 5 and 15 of said surface features per square centimeter.

13. An enclosure for a loudspeaker drive unit, the enclosure comprising:

a chamber defined by one or more walls enclosing an internal volume, said one or more walls including an aperture at which a loudspeaker drive unit is to be mounted, and a port member mounted in said chamber and having an internal surface defining a passageway having a first end opening into said internal volume and a second end opening outside said chamber, said port member providing fluid communication between said internal volume and an exterior of the chamber, the internal surface of said port member being, at least in part, provided with a multiplicity of surface features selected from the group consisting of a multiplicity of indentations, a multiplicity of peaks, and a multiplicity of peaks and indentations, said surface features being provided in said internal surface of said port member, wherein each of said surface features has a depth less than its diameter.

14. An enclosure as set forth in claim 13, wherein said surface features are generally misaligned with one another.

15. An enclosure as set forth in claim 13, wherein said surface features are provided in a moulded plastic material.

16. An enclosure as set forth in claim 13, wherein said surface features are round in cross-section.

17. An enclosure as claimed in claim 13, wherein the enclosure has an internal wall dividing the enclosure into two chambers and said port member passes through said internal wall.

* * * * *